(12) United States Patent
Hsu et al.

(10) Patent No.: US 8,772,156 B2
(45) Date of Patent: Jul. 8, 2014

(54) METHODS OF FABRICATING INTERCONNECT STRUCTURES CONTAINING VARIOUS CAPPING MATERIALS FOR ELECTRICAL FUSE AND OTHER RELATED APPLICATIONS

(75) Inventors: Louis L. Hsu, Fishkill, NY (US);
William R. Tonti, Essex Junction, VT (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 1156 days.

(21) Appl. No.: 12/118,161

(22) Filed: May 9, 2008

(65) Prior Publication Data

US 2009/0280636 A1 Nov. 12, 2009

(51) Int. Cl.
*H01L 21/4763* (2006.01)

(52) U.S. Cl.
USPC .................... 438/642; 438/618; 257/E21.585

(58) Field of Classification Search
USPC ........................................................ 438/650
See application file for complete search history.

(56) References Cited

U.S. PATENT DOCUMENTS

| | | |
|---|---|---|
| 5,097,247 A | 3/1992 | Doerrwaechter |
| 5,585,673 A | 12/1996 | Joshi et al. |
| 5,695,810 A | 12/1997 | Dubin et al. |
| 5,930,667 A | 7/1999 | Oda |
| 6,008,523 A | 12/1999 | Narayan et al. |
| 6,180,503 B1 | 1/2001 | Tzeng et al. |
| 6,225,210 B1 | 5/2001 | Ngo et al. |
| 6,323,554 B1 | 11/2001 | Joshi et al. |
| 6,342,733 B1 | 1/2002 | Hu et al. |
| 6,362,024 B1 | 3/2002 | Kotou et al. |
| 6,541,850 B2 | 4/2003 | Duesman et al. |
| 6,555,458 B1 | 4/2003 | Yu |
| 6,605,874 B2 | 8/2003 | Leu et al. |
| 6,706,625 B1 | 3/2004 | Sudijono et al. |
| 6,730,982 B2 | 5/2004 | Barth et al. |
| 6,764,951 B1 | 7/2004 | van Ngo |
| 6,897,144 B1 | 5/2005 | Ngo et al. |
| 7,009,222 B2 | 3/2006 | Yang |
| 7,122,900 B2 | 10/2006 | Takeda et al. |
| 7,176,126 B2 | 2/2007 | Oh et al. |
| 7,183,195 B2 | 2/2007 | Lee et al. |
| 7,214,594 B2 | 5/2007 | Wong et al. |
| 7,239,004 B2 | 7/2007 | Park et al. |
| 7,285,474 B2 | 10/2007 | Anderson et al. |
| 7,323,760 B2 | 1/2008 | Sakoh |
| 7,361,991 B2 | 4/2008 | Saenger et al. |
| 7,365,001 B2 | 4/2008 | Yang et al. |
| 7,368,801 B2 | 5/2008 | Otsuka et al. |
| 7,391,097 B2 | 6/2008 | Kothandaraman et al. |
| 7,402,463 B2 | 7/2008 | Yang et al. |

(Continued)

OTHER PUBLICATIONS

Notice of Allowance for related U.S. Appl. No. 12/118,186 dated Jan. 28, 2011, 9 pages.

(Continued)

*Primary Examiner* — Cheung Lee
(74) *Attorney, Agent, or Firm* — Anthony Canale; Roberts Mlotkowski Safran & Cole, P.C.

(57) ABSTRACT

Methods are provided for fabricating interconnect structures containing various capping materials for electrical fuses and other related applications. The method includes forming a first interconnect structure having a first interfacial structure and forming a second interconnect structure adjacent to the first structure. The second interconnect structure is formed with a second interfacial structure different from the first interfacial structure of the first interconnect structure.

21 Claims, 10 Drawing Sheets

(56) References Cited

U.S. PATENT DOCUMENTS

| | | |
|---|---|---|
| 7,435,618 B2 | 10/2008 | Chen et al. |
| 7,439,623 B2 | 10/2008 | Harada |
| 7,488,682 B2 | 2/2009 | Yang |
| 7,489,230 B2 | 2/2009 | Ueda |
| 7,501,347 B2 | 3/2009 | Noguchi et al. |
| 7,517,763 B2 | 4/2009 | Park et al. |
| 7,538,353 B2 | 5/2009 | Huang et al. |
| 7,572,682 B2 | 8/2009 | Yang et al. |
| 7,586,196 B2 | 9/2009 | Dubin et al. |
| 7,602,027 B2 | 10/2009 | Burke et al. |
| 7,622,364 B2 | 11/2009 | Adkisson et al. |
| 7,642,176 B2 | 1/2010 | Cheng et al. |
| 7,671,444 B2 | 3/2010 | Wang et al. |
| 7,728,432 B2 | 6/2010 | Takewaki et al. |
| 7,732,893 B2 | 6/2010 | Lyer et al. |
| 7,732,922 B2 | 6/2010 | Yang et al. |
| 7,741,721 B2 | 6/2010 | Black et al. |
| 7,745,905 B2 | 6/2010 | Iwamoto et al. |
| 7,785,934 B2 | 8/2010 | Hsu et al. |
| 7,800,228 B2 | 9/2010 | Yang et al. |
| 7,808,076 B2 | 10/2010 | Kono et al. |
| 7,956,466 B2 | 6/2011 | Hsu et al. |
| 7,960,808 B2 | 6/2011 | Burr et al. |
| 7,968,966 B2 | 6/2011 | Hotta et al. |
| 7,968,967 B2 | 6/2011 | Wang et al. |
| 7,989,913 B2 | 8/2011 | Ueda |
| 8,030,733 B1 | 10/2011 | Naem |
| 8,138,083 B2 | 3/2012 | Yang et al. |
| 8,159,042 B2 | 4/2012 | Yang et al. |
| 8,232,190 B2 | 7/2012 | Bernstein et al. |
| 8,264,062 B2 | 9/2012 | Watanabe |
| 2001/0030366 A1 | 10/2001 | Nakano et al. |
| 2002/0011645 A1 | 1/2002 | Bertin et al. |
| 2002/0149105 A1 | 10/2002 | Yoon et al. |
| 2003/0001267 A1 | 1/2003 | Watanabe |
| 2003/0227089 A1 | 12/2003 | Watanabe et al. |
| 2004/0113279 A1 | 6/2004 | Chen et al. |
| 2004/0145855 A1 | 7/2004 | Block et al. |
| 2004/0207092 A1 | 10/2004 | Burrell et al. |
| 2006/0017153 A1 | 1/2006 | Choi |
| 2006/0118963 A1 | 6/2006 | Yamada |
| 2007/0001307 A1 | 1/2007 | Usui et al. |
| 2007/0032067 A1 | 2/2007 | Nakashima |
| 2007/0155172 A1 | 7/2007 | Lai et al. |
| 2007/0161290 A1 | 7/2007 | Fitzsimmons et al. |
| 2007/0254470 A1 | 11/2007 | Jung |
| 2007/0273002 A1 | 11/2007 | Hwang |
| 2008/0054398 A1 | 3/2008 | Lin et al. |
| 2008/0067627 A1 | 3/2008 | Boeck et al. |
| 2008/0174022 A1 | 7/2008 | Chen et al. |
| 2008/0206978 A1 | 8/2008 | Hsu et al. |
| 2009/0085152 A1 | 4/2009 | Bernstein et al. |
| 2009/0109722 A1 | 4/2009 | Hsu et al. |
| 2009/0174075 A1 | 7/2009 | Yang et al. |
| 2009/0243113 A1 | 10/2009 | Tuten et al. |
| 2009/0261450 A1 | 10/2009 | Cheng et al. |
| 2009/0294902 A1 | 12/2009 | Yoshimura et al. |
| 2010/0090751 A1 | 4/2010 | Cheng et al. |
| 2012/0276732 A1 | 11/2012 | Lin et al. |
| 2013/0049166 A1 | 2/2013 | Yonezu et al. |

OTHER PUBLICATIONS

Ex Parte Quayle Action dated Aug. 6, 2013 in related U.S. Appl. No. 13/780,471, 5 pages.

Notice of Allowance for related U.S. Appl. 13/537,879 dated May 30, 2013, 9 pages.

Office Action for related U.S. Appl. No. 13/537,879 dated Feb. 5, 2013, 5 pages.

Notice of Allowance for related U.S. Appl. No. 13/052,662 dated May 4, 2012, 9 pages.

Office Action for related U.S. Appl. No. 13/052,662 dated Dec. 5, 2011, 6 pages.

Notice of Allowance for related U.S. Appl. No. 13/780,471, dated Nov. 18, 2013, 10 pages.

An Interconnect Containing 2 Different Cap Materials

METHODS OF FABRICATING INTERCONNECT STRUCTURES CONTAINING VARIOUS CAPPING MATERIALS FOR ELECTRICAL FUSE AND OTHER RELATED APPLICATIONS

CROSS-REFERENCE TO RELATED APPLICATIONS

This application is related to U.S. Ser. No. 12/118,186 filed on the same day and currently pending.

FIELD OF THE INVENTION

The invention relates to methods of fabricating interconnect structures containing various capping materials for electrical fuses and other related applications.

BACKGROUND

A fuse is a structure that is blown in accordance with a suitable electrical current. For example, an electrical current is provided through the fuse to eventually provide an open circuit condition. In integrated circuitry memory devices, fuses can be used for activating redundancy in memory chips and for programming functions and codes in logic chips. Specifically, dynamic random access memory (DRAM) and static random access memory (SRAM) employ fuses for such purposes.

Electronic fuses can also be used to prevent reduction of yield, which may be caused by random defects, generated in the manufacturing process. Moreover, fuse links provide for voltage options, packaging pin out options, or any other option desired by the manufacturer to be employed prior to the final processing. This helps increase yield and makes it easier to use one basic design for several different end products.

Some electrically blowable fuses take advantage of the electromigration (EM) effect to open an electrical connection. For example, EM is the transport of material caused by the gradual movement of ions in a conductor due to the momentum transfer between conducting electrons and diffusing metal atoms. In electrically blowable fuses that take advantage of EM effect, such transport of material caused by the gradual movement of ions can open the electrical connection.

However, in a typical e-fuse the EM effect causes undesirable hillocks. More specifically, known e-fuses comprise a two-dimensional dog-bone shape having a small cross-sectional area between large cathode and anode pads. During programming, voids form at the center fuse element due to high current density, and eventually create an electrically open circuit. However, the electromigration causes the conductive material to pile-up and form hillocks at the anode end of the fuse element. Hillock formation is an undesirable effect that has not been exploited for any useful purpose.

Accordingly, there exists a need in the art to overcome the deficiencies and limitations described hereinabove.

SUMMARY

In a first aspect of the invention, a method comprises forming a first interconnect structure having a first interfacial structure and forming a second interconnect structure adjacent to the first structure. The second interconnect structure is formed with a second interfacial structure different from the first interfacial structure of the first interconnect structure.

In another aspect of the invention, a method comprises forming a wiring interconnect structure and an electronic fuse interconnect structure by a same process flow. The same process flow includes depositing a first wiring layer in a trench of a first dielectric; depositing a second wiring layer in a trench in a second dielectric; forming an interconnection which electrically connects the first wiring layer and the second wiring layer; and depositing a capping material over the second wiring layer. In the formation of the electronic fuse, the capping material and/or the second wiring layer of the electronic fuse interconnect structure undergoes a process which changes its interfacial properties while protecting the capping material over the wiring interconnect structure.

In yet another aspect of the invention, a method comprises forming a first macro having a metal wiring layer on a first level electrically connected to a metal wiring layer on a second layer and a capping layer over the metal wiring layer on the second layer which has a first electromigration (EM) resistance. The method further comprises forming a second macro adjacent the first macro. The second macro is formed with a metal wiring layer on the first level electrically connected to a metal wiring layer on the second layer with a same process flow of the first macro, and additionally includes forming a capping layer over the metal wiring layer on the second layer which has a second electromigration (EM) resistance different from the first electromigration (EM) resistance.

In still a further aspect of the invention, a method of forming an interconnect structure comprises forming a first macro having a first e-fuse programmability comprising an upper wiring layer capped by a capping material. The method further comprises forming a second macro having a second e-fuse programmability comprising an upper wiring layer formed in the same processing step as the first macro. The formation of the second macro comprises capping the second macro that has interfacial properties different than that of the first macro.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to methods of fabricating interconnect structures containing various capping materials for electrical fuses (e-fuses) and other related applications. More specifically, the present invention teaches interconnect structures, which may be implemented as either normal interconnects or e-fuses. The methods teach the formation of structures that include various capping layer materials at an interface with a metal wiring layer to provide different interfacial properties, e.g., EM resistance.

Advantageously, the formation of the interconnect structure and e-fuses of the present invention can be implemented in FEOL, BEOL, and FBEOL, and are compatible with current process flows. The present invention thus allows the building of e-fuses during normal interconnect process flows, advantageously reducing processing costs for manufacturing e-fuses which are normally fabricated in different process flows. Also, in accordance with different embodiments, depending on the materials used herein (as discussed in detail below) the e-fuse can be programmed to blow at different current levels. EM effects in the e-fuses of the present invention will not cause undesirable hillocks at the anode end of the fuse element.

Figure 1:
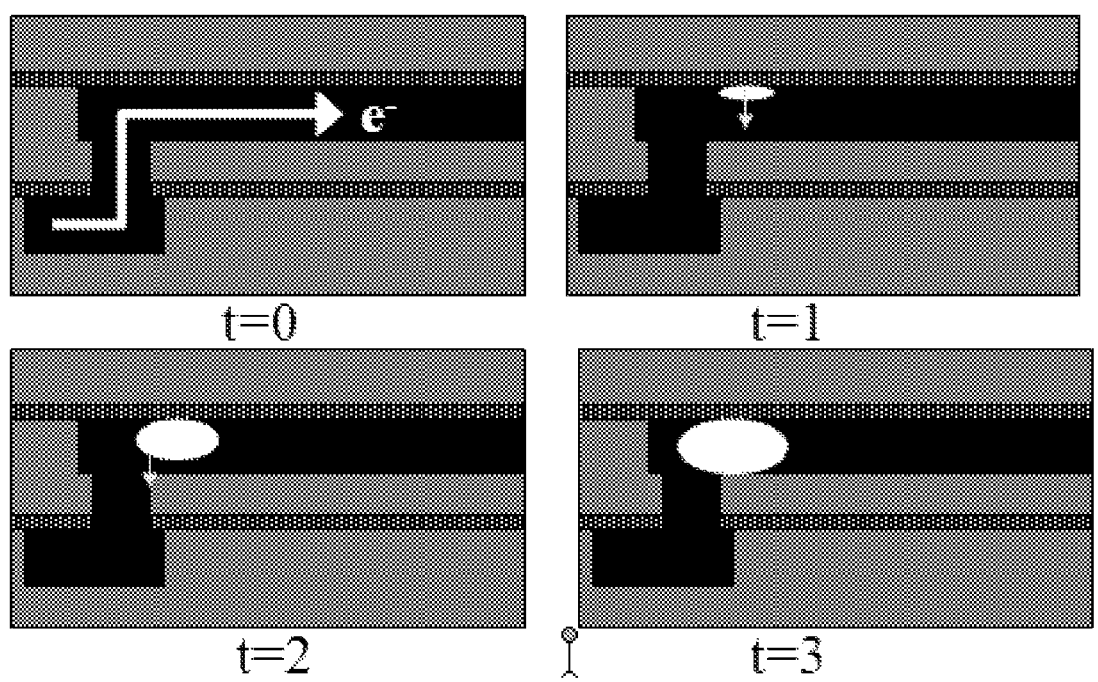
FIG. 1 shows the formation of void nucleation sites.

By way of example, FIG. 1 shows an EM failure mode in an interconnect structure (or an e-fuse in accordance with the invention). Generally, three major diffusion paths have been identified in the EM failure mechanism. These failure mechanisms can be, for example, Cu/capping layer interface;
Cu grain boundary; and
Cu/barrier (Ta) interface.

The dominant diffusion path depends on the process. For example, in certain products/processes, the Cu/capping layer interface is the most critical interface controlling the EM performance.

More specifically, multilayer electronic components comprise multiple layers of a dielectric material having metallization on each layer in the form of vias, pads, straps connecting pads to vias and wiring. Vias or other openings in the dielectric layer extend from one layer to another layer. These openings are filled with a conductive material and electrically connect the metallization on one layer to the metallization on another layer and provide for the high-density electronic components devices now used in industry. Metallization metal may be formed using a filling technique such as electroplating, electroless plating, chemical vapor deposition, physical vapor deposition or a combination of methods. The metal wiring is capped with a dielectric capping layer, which may be, for example, nitride.

As shown in FIG. 1, at t=0, the electrons are shown to be moving through the wiring pattern, However, as time passes, voids (void nucleation sites) begin to form at the interface between the upper wiring layer and the dielectric capping layer. At t=3, for example, the void becomes so large that it effectively opens the circuit thus resulting in a failure of the wiring layer. In the case of a fuse, this open circuit is a blown fuse.

Figure 2:
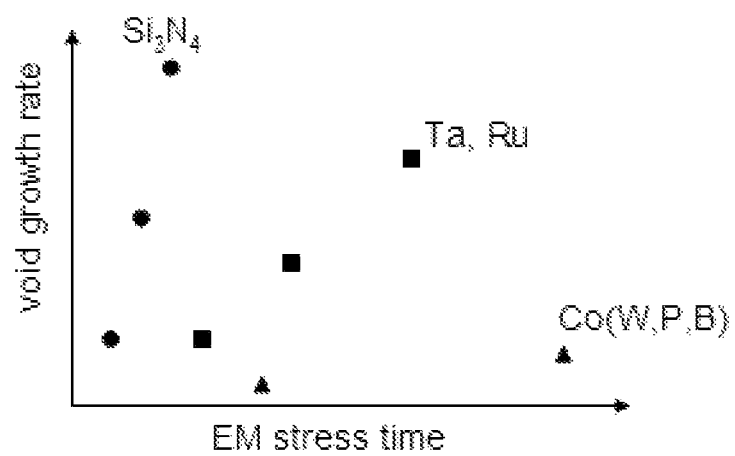
FIG. 2 shows a graph of different void growth rates for cap interface materials in accordance with the invention.

FIG. 2 shows a graph of different void growth rates for cap interface materials used in accordance with the invention. More specifically, FIG. 2 shows a graph of different void growth rates over EM stress time. After extensive experimentation, it has been found that different void growth rates are provided with different Cu/cap interface materials. As important, it was found that EM resistance behaves differently between different capping materials.

In particular, as shown in FIG. 2, SiN ($Si_3N_4$) shows the fastest void growth rate over EM stress time. Ta and Ru show a slower void growth rate over EM stress time, with any combination of Co(W, P, B) showing the slowest void growth rate over EM stress time. Although Ta and Ru and any combination of Co (W, P, B) are shown grouped together, respectively, those of skill in the art should be understood that these materials will also have certain variations in void growth rate.

With the data shown in FIG. 2, in a regular interconnect, it is possible to select a good Cu/capping layer interface (e.g., SiN) to prevent the formation of void nucleation sites. However, it is also desirable to select poor interface materials (e.g., Ta, Ru and any combination of Co (W, P, B)) for e-fuse applications. As such, in accordance with the invention, by creating various interfaces which result in different EM resistance during same process flows, it is now possible to fabricate an e-fuse application using process flows of an interconnect structure. This now being possible, the invention contemplates programmable e-fuses using different capping materials and, in embodiments, by damaging existing capping materials, any of which exhibit differences in EM resistance when used as a Cu capping layer. Also, the present invention should not be limited to the above materials, in that other materials, e.g., Rh and Pt, will provide different void growth rates for cap interface materials in accordance with the invention.

METHODS IN ACCORDANCE WITH THE INVENTION

Figure 3:
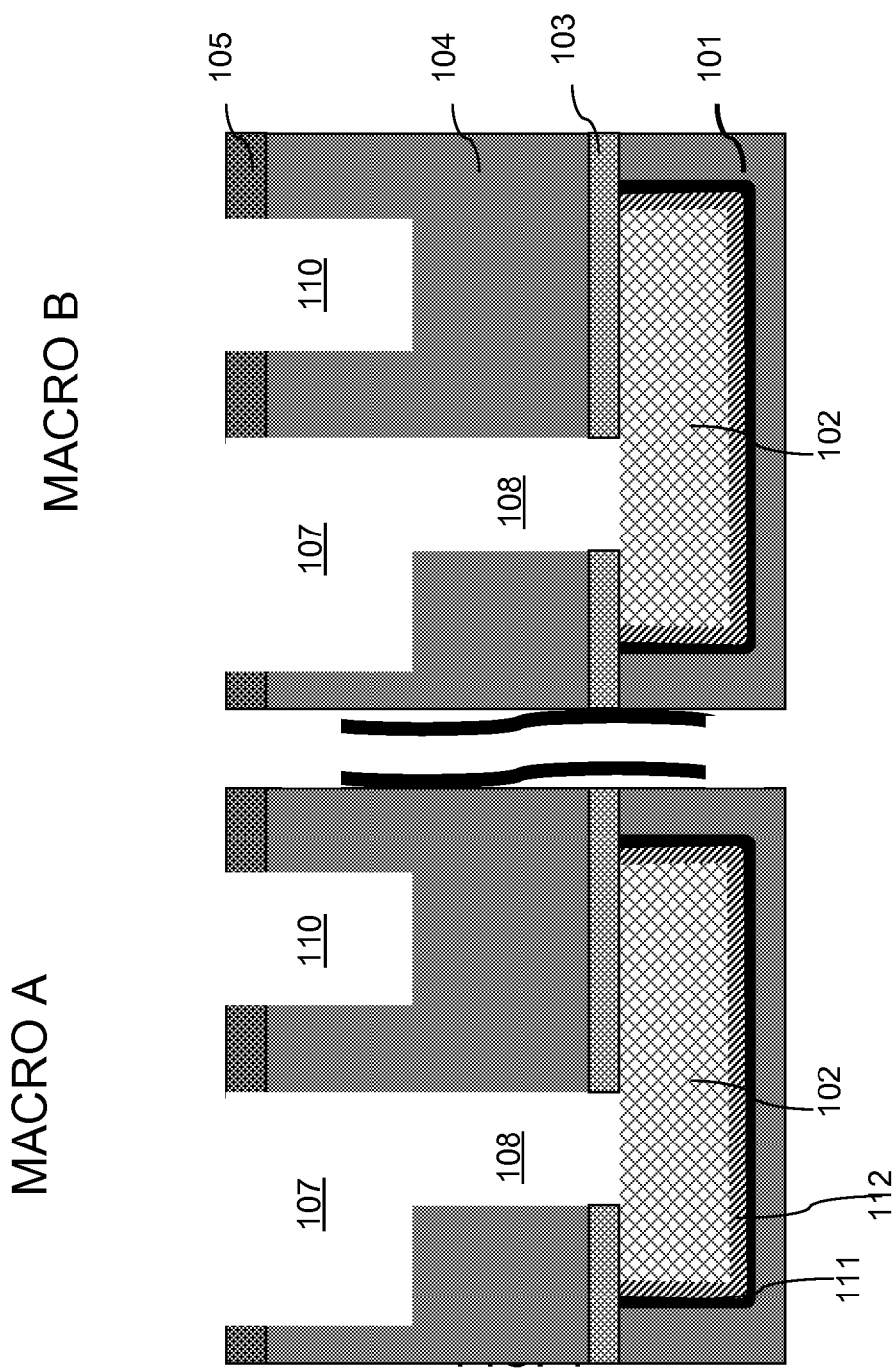
FIG. 3 shows a beginning structure and respective processing steps in accordance with the invention.

FIG. 3 shows a beginning structure and respective processing steps in accordance with the invention. In particular, FIG. 3 shows identical macros, Macro A and Macro B. The Macro A and Macro B will eventually be formed into two or more different structures having different programming efficiencies, implemented as e-fuses or wiring interconnect structures, for example.

Macro A and Macro B include a dielectric layer 101. The dielectric layer 101 may be, for example, $SiO_2$, $Si_3N_4$, SiCOH, SiLK, JSR, or porous dielectrics. The dielectric layer 101 could be any interconnect layer in the structure. In conventional lithographic and etching processes, a trench is formed in the dielectric layer 101. Materials are then deposited in the trench in conventional deposition processes to form an underlying metal interconnect 102. For example, a barrier/liner material 111 such as TaN is deposited in the trench. A barrier/liner material 112, e.g., Ta is deposited over the barrier/liner material 111. A metal interconnect material 102 is deposited over the barrier/liner material 112. The metal interconnect material 102 may be, for example, Cu, Al, Al(Cu) or W to name a few.

Still referring to FIG. 3, a dielectric capping layer 103 is deposited over the structure, in a conventional deposition process such as, for example, chemical vapor deposition. The dielectric capping layer 103 may be, for example, $Si_3N_4$, SiC, SiC(N,H) or other known capping materials. A dielectric layer 104 is deposited over the capping layer 103 in a conventional deposition process. The dielectric layer 104 may be, for example, $SiO_2$, $Si_3N_4$, SiCOH, SiLK, JSR, or porous dielectrics. A hard mask 105 is then deposited over the dielectric layer 104. The hard mask 105 may be, for example, $SiO_2$, $Si_3N_4$.

Via 108 and trenches 107 and 110 are formed in the structure in accordance with conventional trench or via formation processes. For example, a conventional dual damascene process and a single damascene process can be used to form the features 107, 108, 110. More specifically, a conventional lithographic and etching (e.g., RIE) process can be used to form the feature 108 and a second conventional lithographic and etching process can be used to form the features 107, 110. The formation of via 108 exposes the underlying interconnect 102.

Figure 4:
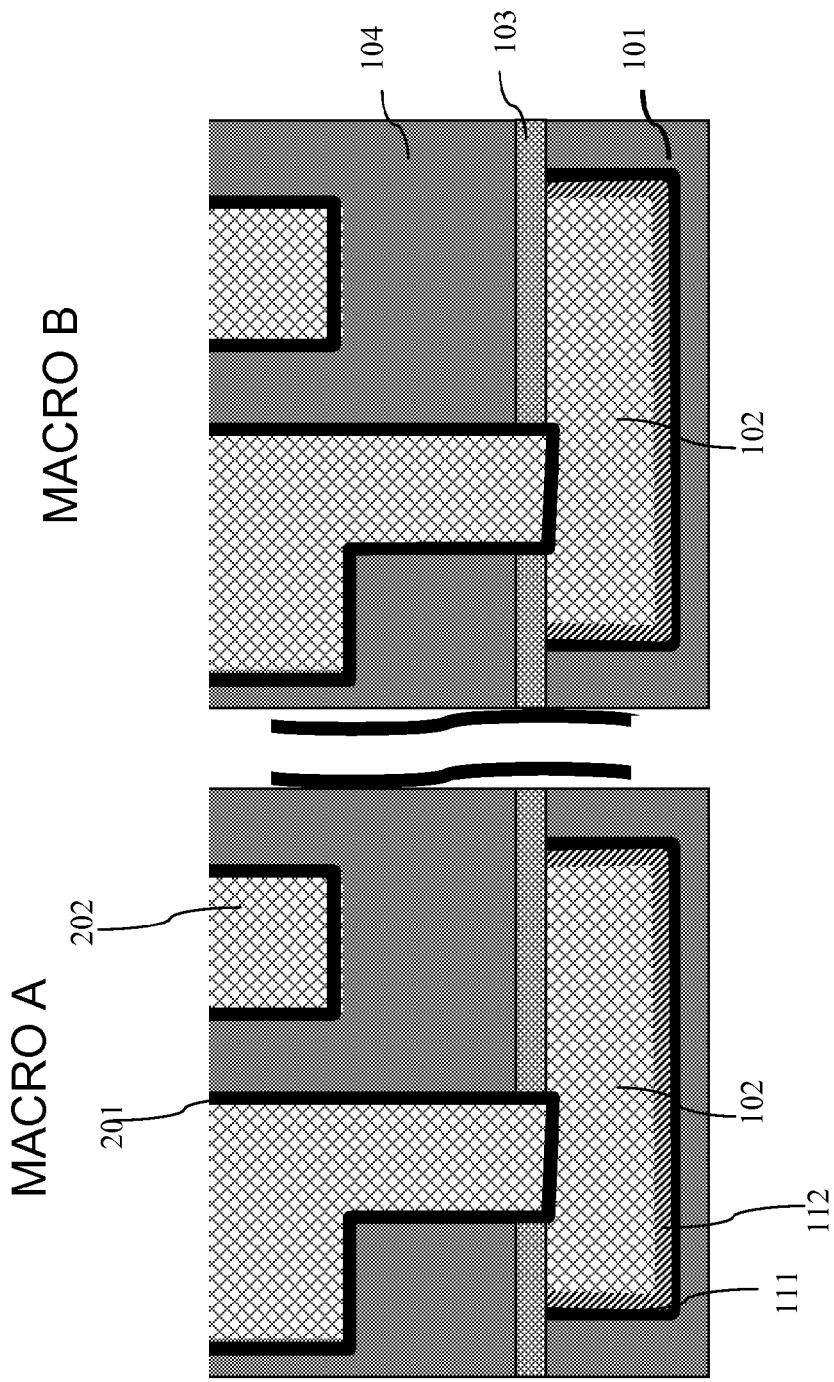
FIGS. 4-6 show intermediate structures and respective processing steps in accordance with the invention.
Figure 5:
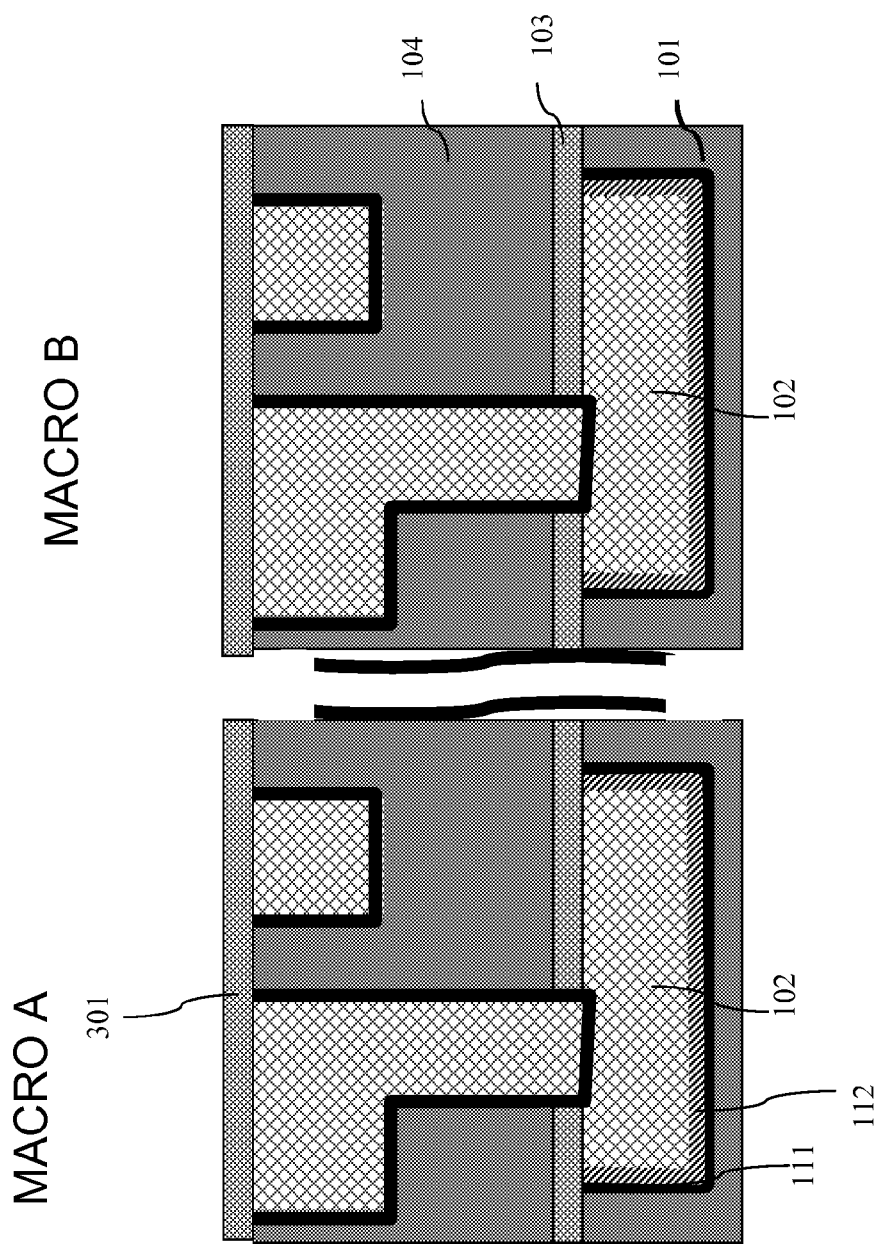
Figure 6:
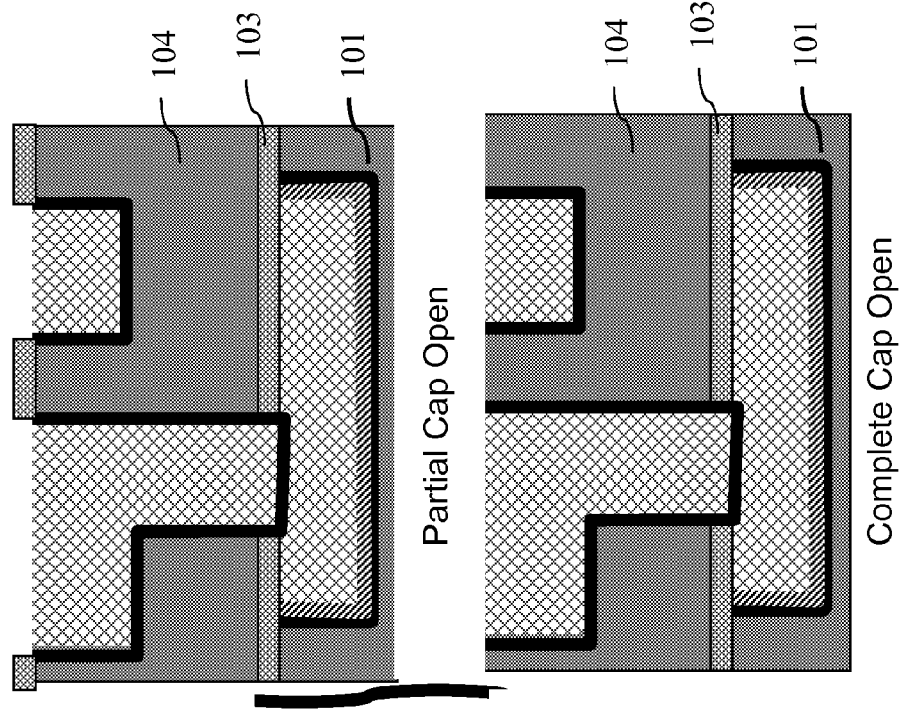
Figure 6:
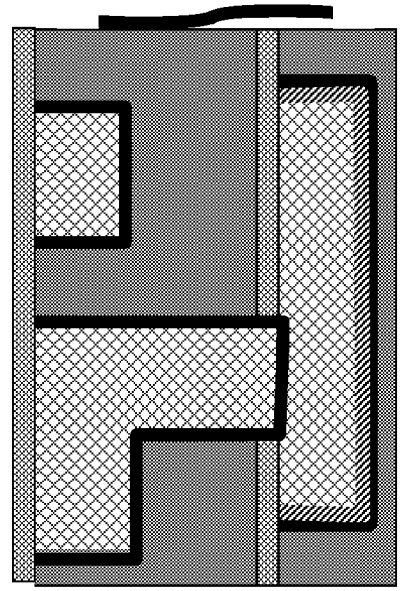

FIGS. 4-6 show intermediate structures and respective processing steps in accordance with the invention. In FIG. 4, for example, a liner 201 is formed on the sidewalls of the features 107, 108, 110. The liner 201 may be, for example, Ta(N), Ti(N), RuTa(N) or IrTa(N). In further processing steps, copper material is deposited in the structures 107, 108, 110 and over the liner 210 to form a metal interconnect 202. A conventional chemical mechanical polishing step may be provided to remove any extra conducting material 202 from the structure, e.g., polish the structure.

FIG. 5 shows a dielectric capping layer deposition process in accordance with the invention. In this processing step, a capping layer 301 is deposited over the structures (Macro A and Macro B) of FIG. 4. The capping layer 301 may be, for example, $Si_3N_4$ or SiC(N,H). In embodiments, the capping layer 310 is about 100 Å to 800 Å.

FIG. 6 shows alternate processing steps for Marco B. In particular, in Macro B, the capping layer 301 can be partially or completely removed using conventional etching processes. In the partial removal scenario, the capping layer 301 preferably is removed over the metal interconnect 202, remaining over the dielectric layer 104. In embodiments, Macro A remains protected by a mask during the etching of the capping layer 301 on Macro B.

Figure 7:
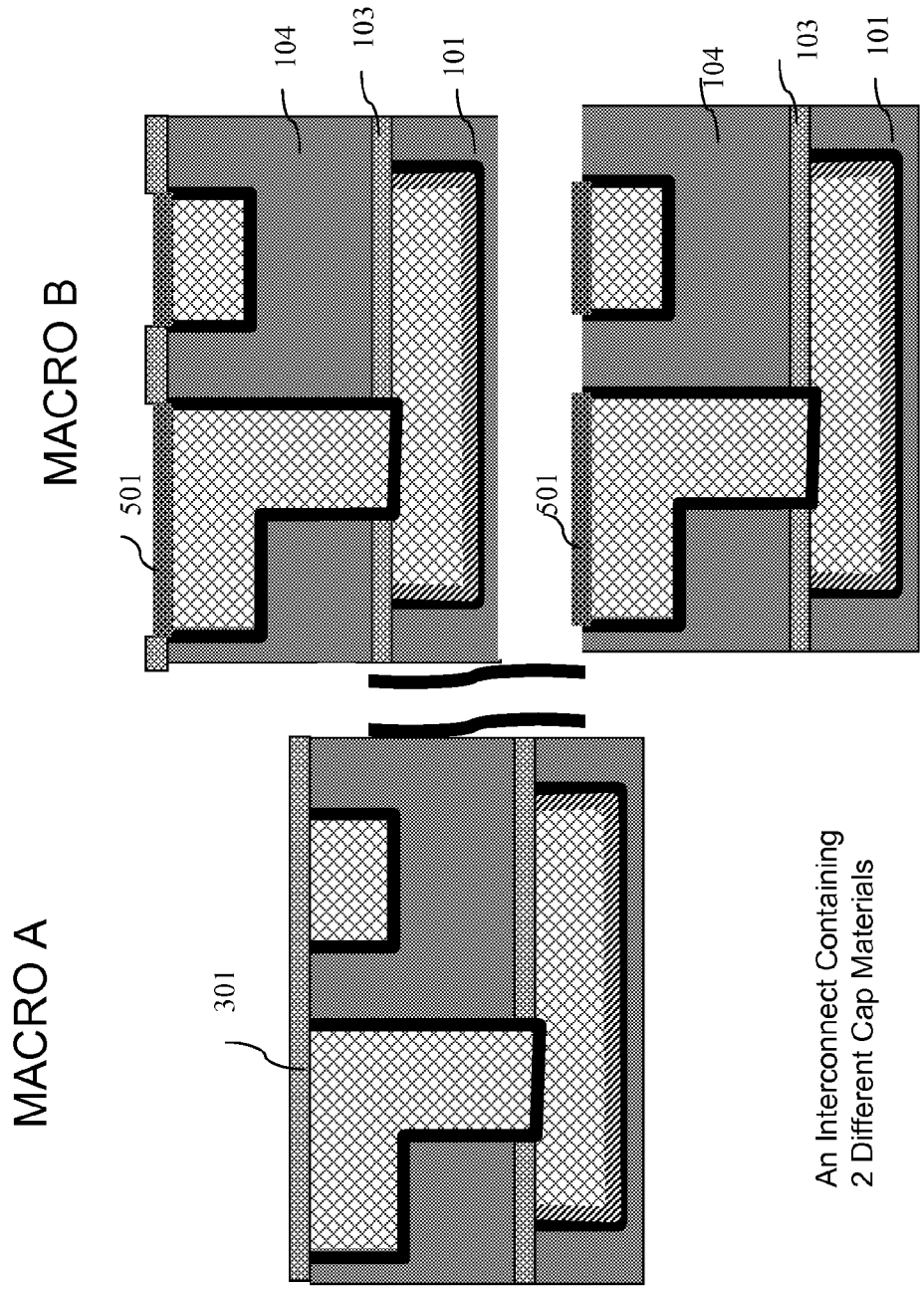
FIG. 7 shows alternative final structures and respective processing steps in accordance with the invention.

FIG. 7 shows a selective metal cap deposition on the alternative Macro B structures of FIG. 6. During this process, Macro A remains masked. The selective metal cap deposition 501 of the alternative Macro B structures include, for example, Co(W,P,B), Ru, Ir, Rh or Pt. The metal cap deposition 501 may be about 5 A to 500 A. The metal cap deposition process could be through CVD, ALD, electro plating, and electroless plating process. Those of skill in the art will understand that the metal cap deposition 501 may be other materials, depending on the desired programming efficiencies of the e-fuse. In embodiments, if the metal cap deposition is not selective, it is possible to provide a CMP touch up process to remove any unwanted deposition metals 501.

Figure 8:
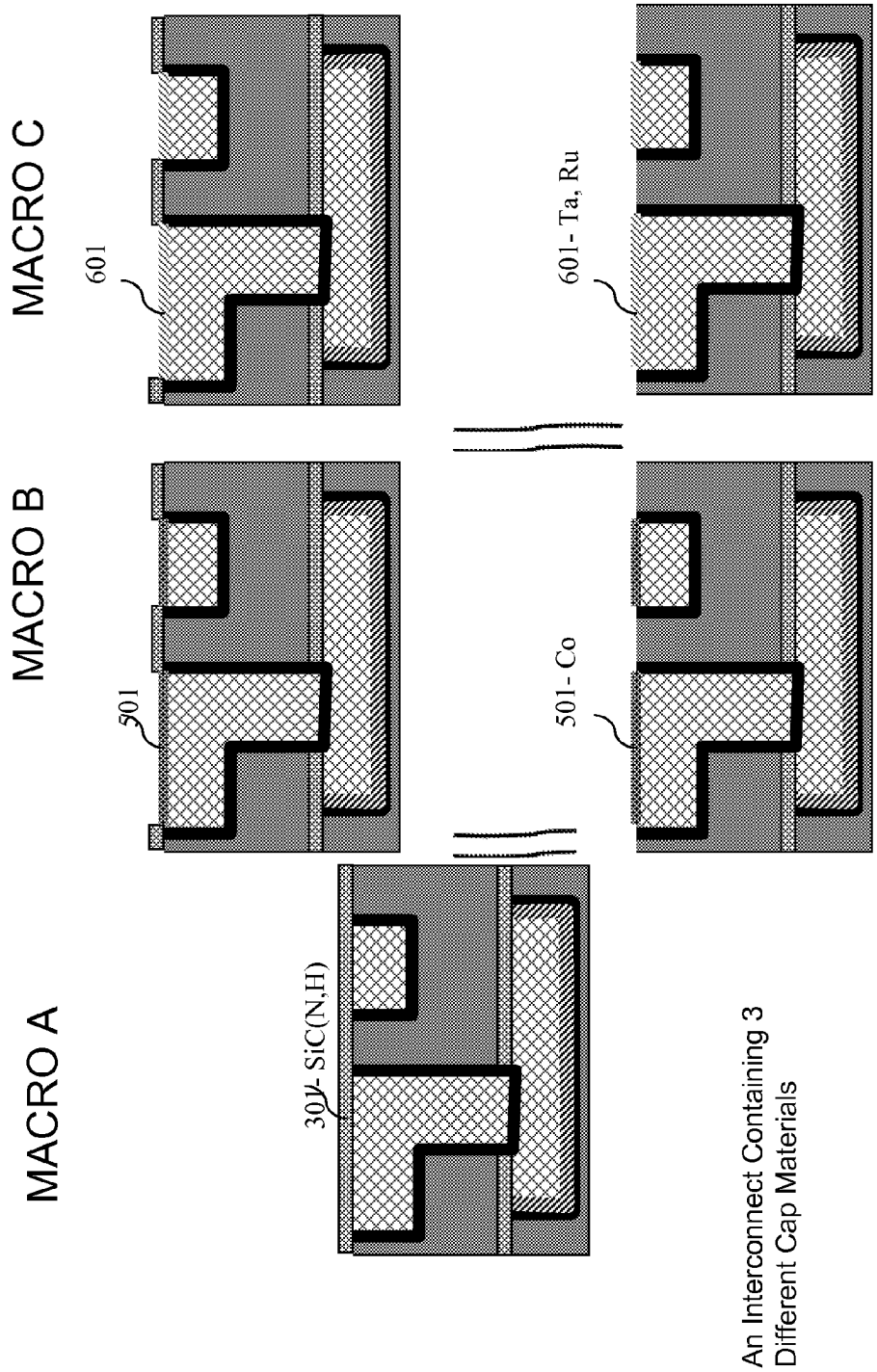
FIG. 8 shows alternative final structures and respective processing steps in accordance with the invention.

FIG. 8 shows a third macro, Macro C, provided in accordance with the invention. Macro C can be formed simultaneously with Macros A and B in accordance with the processing steps of FIGS. 3-6. In this embodiment, a metal cap deposition material 601 is deposited over Macro C, while Macros A and B remain protected by a mask. The cap deposition material 601 on Macro C is different than the metal cap deposition material 501 (described with reference to FIG. 7) on Macro B. By way of one NON-LIMITING example, the metal cap deposition material 501 is Co and the metal cap deposition material 601 is Ru; although other combinations of materials (and/or combinations of partial or complete openings) are also contemplated by the invention.

In the illustrative embodiment shown in FIG. 8, Macro B has a greater EM resistance than Macro C and Macro A. Macro C has a greater EM resistance than Macro A. As such, Macro A has greater fuse efficiency than Macro B and Macro C. Also, Macro B has greater fuse efficiency than Macro C.

As thus shown in the exemplary representation of FIG. 8, different cap materials, i.e., different Cu/cap interfaces, results in different EM resistance, i.e. different EM life time. This being the case, Macros with a poor interface can be used as an e-fuse, and Macros with a good interface can be used as the normal interconnect. Also, using any combination of Macros (and combinations of materials and openings), it is possible to have different e-fuses (with different programmability) made on the same device using substantially the same processing. In this way, the multi-interface structure may provide circuit programming.

Figure 9:
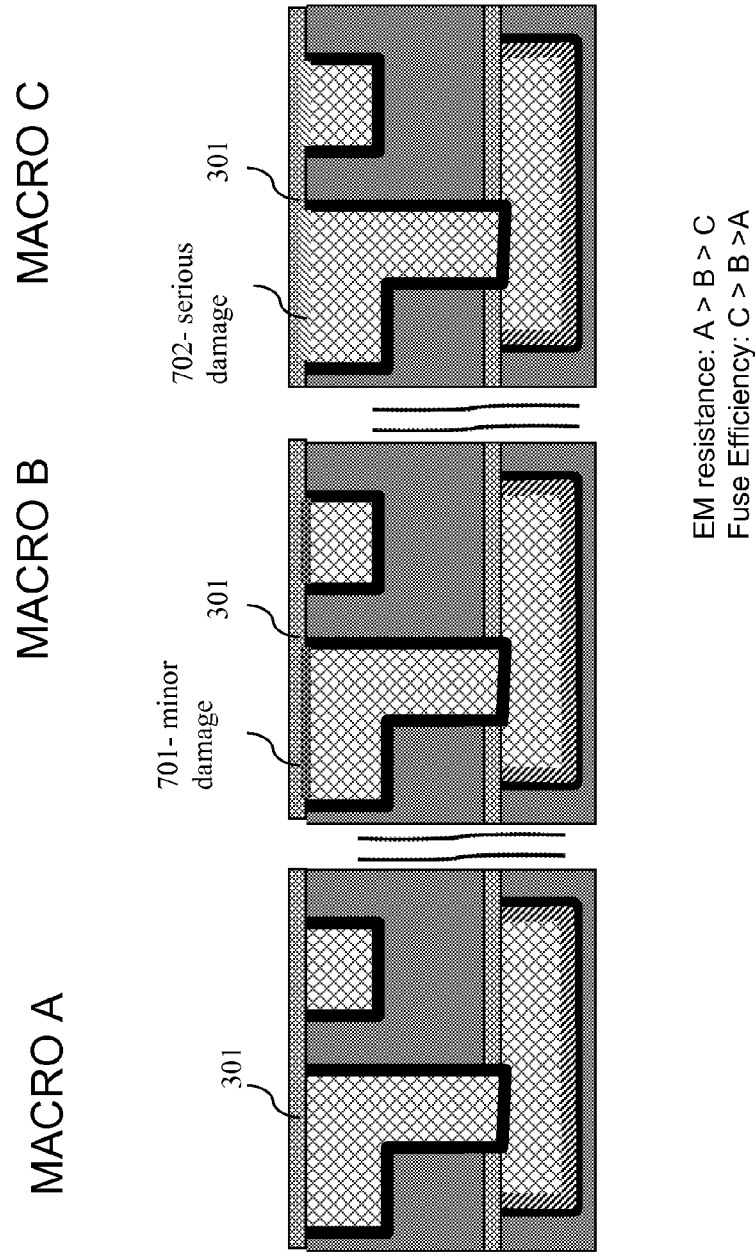
FIG. 9 shows alternative final structures and respective processing steps in accordance with the invention.

FIG. 9 shows a second embodiment in accordance with the invention. In this embodiment, Macros A, B and C have the same dielectric cap material 301. However, Macros B and C are subjected to different amount/degree of treatments, either prior or post the cap material 301 deposition, to degrade the interfacial property between the metal and the dielectric cap layer, e.g., adhesion. The treatment includes radiation sources such as e-beam, ultraviolet light, visible light, or laser light for altering the interfacial property discussed above. FIG. 9 can equally be representative of two (or more) Macros, with different treatments or in combination with different treatments and materials as described already herein.

In FIG. 9, area 701 on Macro B is provided with minor damage; whereas, Macro C has serious damage 702. In this illustrative embodiment, Macro A has a greater EM resistance than Macro B and Macro C. Macro B has a greater EM resistance than Macro C. As such, Macro C has greater fuse efficiency than Macro B and Macro A. Also, Macro B has greater fuse efficiency than Macro A.

Again, as in the previous embodiments, the advantage of the embodiment of FIG. 9 is to create different Cu/cap interfaces, which results in different EM resistance, i.e., different EM life time. The Macros with poor interface properties can be used as e-fuses, while the Macros with good interface properties can be used as normal interconnects. Also, this multi-interface structure can have potential on circuit programming.

Figure 10:
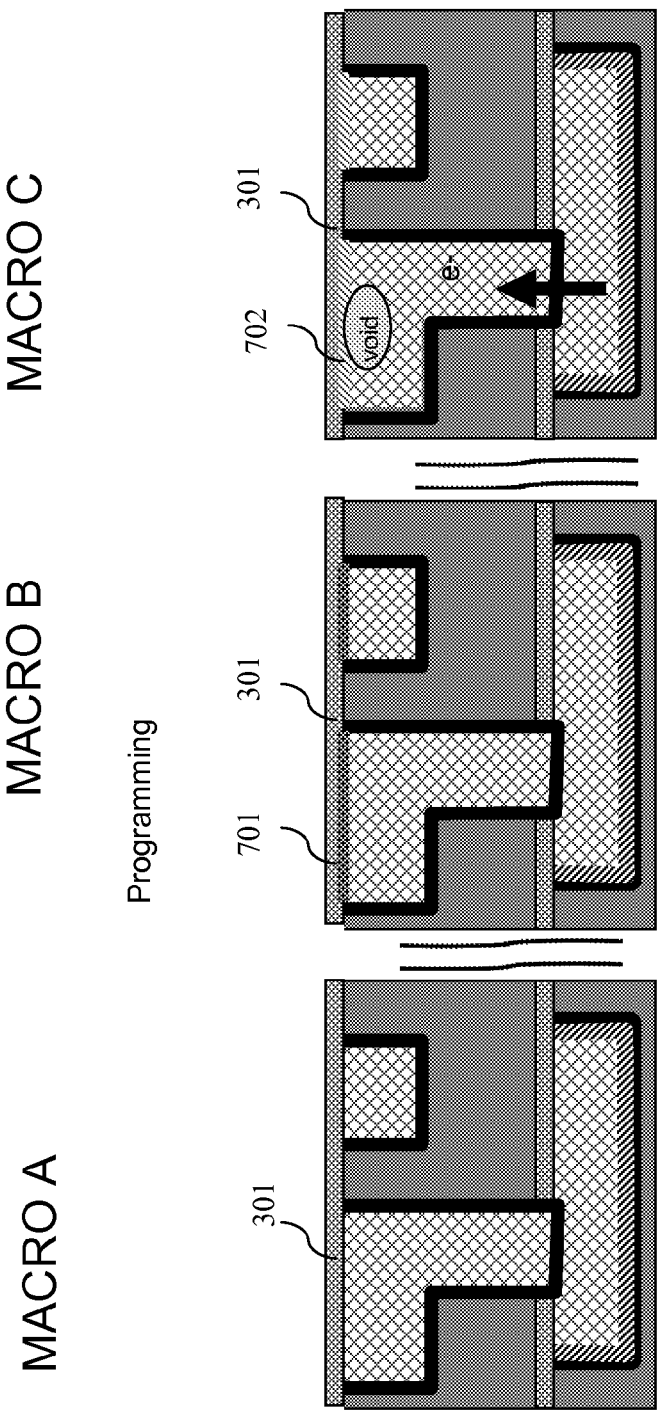
FIG. 10 shows a final structure with the formation of a void nucleation site in accordance with the invention.

FIG. 10 shows formation of void nucleation sites in structures fabricated in accordance with the invention. More particular, FIG. 10 illustratively shows void formation in the embodiment of FIG. 9. More specifically, void formation (i.e., an open circuit) due to EM effects is shown in the serious damage area 702 of Macro C. The void formation will effectively blow the fuse.

Fabrication of Integrated Circuit Chips

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

While the invention has been described in terms of embodiments, those of skill in the art will recognize that the invention can be practiced with modifications and in the spirit and scope of the appended claims.

What is claimed is:

1. A method comprising:
   forming a first interconnect structure having a first interfacial structure connecting to a first underlying interconnect material; and
   forming a second interconnect structure having a second interfacial structure different from the first interfacial structure and connecting to a second underlying interconnect material, wherein:
   the first interconnect structure and second interconnect structure are different structures, and the first interfacial structure is formed with a metal layer and a capping layer and the second interfacial structure is formed with a metal layer in a same process as the metal layer of the first interfacial structure and a capping layer comprising different material than the capping layer of the first interfacial structure.

2. The method of claim 1, wherein the first interconnect structure is a wiring interconnect structure and the second interconnect structure is an e-fuse.

3. The method of claim 2, wherein the first interfacial structure has a greater electromigration (EM) resistance than the second interfacial structure.

4. The method of claim 1, further comprising forming a third interconnect structure having a third interfacial structure, different from the first and second interfacial structures.

5. A method comprising:
forming a first interconnect structure having a first interfacial structure; and
forming a second interconnect structure having a second interfacial structure different from the first interfacial structure,
wherein the first interconnect structure is a wiring interconnect structure and the second interconnect structure is an e-fuse, and
wherein the first interfacial structure is formed with a metal layer and a capping layer comprising SiN and the second interfacial structure is formed with a metal layer in a same process as the metal layer of the first interfacial structure and a capping layer comprising one of: Co(W, P,B), Ru, Ir, Rh and Pt.

6. A method comprising:
forming a first interconnect structure having a first interfacial structure; and
forming a second interconnect structure having a second interfacial structure different from the first interfacial structure,
wherein the first interconnect structure is a wiring interconnect structure and the second interconnect structure is an e-fuse, and
wherein the first interfacial structure is formed with a same material as the second interfacial structure and further comprising degrading interfacial properties between a metal layer and capping layer of the second interfacial structure.

7. The method of claim 6, wherein the degrading includes a damaging treatment from one of radiation sources and laser light.

8. A method comprising:
forming a first interconnect structure having a first interfacial structure; and
forming a second interconnect structure having a second interfacial structure different from the first interfacial structure,
wherein the first interconnect structure is a wiring interconnect structure and the second interconnect structure is an e-fuse, and
wherein:
forming the first interconnect structure and the second interconnect structure includes forming in a same processing flow a first wiring layer in a first dielectric, forming a second wiring layer in a second dielectric, forming an electrical interconnect between the first wring layer and the second wiring layer, and forming a capping layer over the second wiring layer through a deposition process; and
forming the second interconnect structure further includes one of:

(i) damaging the capping layer or upper second wiring layer on the second interconnect structure in certain areas/macros and (ii) etching away at least portions of the capping layer over the second wiring layer and depositing another capping material over the second wiring layer in certain areas/macros.

9. The method of claim 8, wherein the another capping material or the damaged capping layer provides a different EM resistance than the capping layer of the first interconnect structure.

10. A method comprising:
forming a wiring interconnect structure and an electronic fuse interconnect structure by a same process flow which comprises:
depositing a first wiring layer in a trench of a first dielectric;
depositing a second wiring layer in a trench in a second dielectric;
forming an interconnection which electrically connects the first wiring layer and the second wiring layer; and
depositing a capping material over the second wiring layer, and
wherein one of the capping material and the second wiring layer of the electronic fuse interconnect structure undergoes a process which changes its interfacial properties while protecting the capping material over the wiring interconnect structure.

11. The method of claim 10, wherein the capping layer comprises SiN.

12. The method of claim 10, wherein the undergoing the process of the electronic fuse interconnect structure comprises:
etching the capping layer at least over the second wiring layer to remove the capping layer, while the capping layer of the wiring interconnect structure is protected, and
depositing a material over the second wiring layer that provides a different interfacial property than the SiN deposited over the wiring interconnect structure.

13. The method of claim 12, wherein the material that provides a different interfacial property is one of: Co(W,P,B), Ru, Ir, Rh and Pt.

14. The method of claim 10, wherein the undergoing the process of the electronic fuse interconnect structure comprises a treatment from one of radiation sources and laser light.

15. The method of claim 10, further comprising forming a second electronic fuse interconnect using the same process flow, wherein a capping layer of the second electronic fuse interconnect undergoes further processing such that an interfacial property of the second electronic fuse is different from a first and second interfacial property of the wiring interconnect structure and the electronic fuse interconnect structure.

16. A method comprising:
forming a first macro having a metal wiring layer on a first level electrically connected to a metal wiring layer on a second layer and a capping layer over the metal wiring layer on the second layer which has a first electromigration (EM) resistance; and
forming a second macro adjacent the first macro, the second macro being formed with a metal wiring layer on the first level electrically connected to a metal wiring layer on the second layer with a same process flow of the first macro, and additionally forming a capping layer over the metal wiring layer on the second layer which has a second electromigration (EM) resistance different from the first electromigration (EM) resistance.

17. The method of claim 16, wherein the capping layer of the first macro is SiN and the capping layer of the second macro is one of Co(W,P,B), Ru, Ir, Rh and Pt.

18. The method of claim 16, wherein the capping layer of the first and the second macro is a same material, and the capping layer on the second macro and/or the metal wiring layer on the second layer of the second macro is damaged thereby providing a different electromigration (EM) resistance than that of the first macro.

19. A method of forming an interconnect structure comprising:
- forming a first macro having a first e-fuse programmability comprising an upper wiring layer capped by a capping material; and
- forming a second macro having a second e-fuse programmability comprising an upper wiring layer formed in the same processing step as the first macro and capping the second macro having interfacial properties different than that of the first macro.

20. The method of claim 19, wherein the capping of the second macro includes a same material as the first macro and further includes damaging the material or the upper wiring layer of the second macro.

21. The method of claim 19, wherein the capping of the second macro includes a same material as the first macro and further comprising etching of the same material on the second macro to remove the same material and depositing another type of material.

* * * * *